(12) United States Patent
Gonzalez et al.

(10) Patent No.: US 7,115,185 B1
(45) Date of Patent: Oct. 3, 2006

(54) PULSED EXCITATION OF INDUCTIVELY COUPLED PLASMA SOURCES

(75) Inventors: Juan Jose Gonzalez, Fort Collins, CO (US); Fernando Gustavo Tomasel, Fort Collins, CO (US); Andrew Shabalin, Fort Collins, CO (US)

(73) Assignee: Advanced Energy Industries, Inc., Fort Collins, CO (US)

( * ) Notice: Subject to any disclaimer, the term of this patent is extended or adjusted under 35 U.S.C. 154(b) by 74 days.

(21) Appl. No.: 10/663,104

(22) Filed: Sep. 16, 2003

(51) Int. Cl.
*C23F 1/02* (2006.01)
*C23C 16/00* (2006.01)
*H01J 7/24* (2006.01)

(52) U.S. Cl. ............................ 156/345.44; 156/345.48; 118/723 R; 118/723 I; 315/111.41

(58) Field of Classification Search ................ 156/345; 118/723; 315/111
See application file for complete search history.

(56) References Cited

U.S. PATENT DOCUMENTS

| 5,330,578 | A | * | 7/1994 | Sakama et al. | ......... 118/723 R |
| 5,654,679 | A | | 8/1997 | Mavretic et al. | ........... 333/17.3 |
| 6,150,628 | A | | 11/2000 | Smith et al. | ........... 219/121.54 |
| 6,679,981 | B1 | * | 1/2004 | Pan et al. | ............... 204/298.06 |
| 2003/0024643 | A1 | * | 2/2003 | Abatchev et al. | ......... 156/345.1 |
| 2004/0060660 | A1 | * | 4/2004 | Klimecky et al. | ..... 156/345.28 |
| 2004/0121603 | A1 | * | 6/2004 | Chiu et al. | .................. 438/690 |

* cited by examiner

*Primary Examiner*—Tuyet Thi Vo
(74) *Attorney, Agent, or Firm*—Blakely Sokoloff Taylor & Zafman LLP

(57) ABSTRACT

The reaction rate of a feed gas flowed into a plasma chamber is controlled. In one embodiment a pulsed power supply repeatedly applies a high power pulse to the plasma chamber to increase the reaction rate of plasma within the chamber, and applies a low power pulse between applications of the high power pulses.

28 Claims, 8 Drawing Sheets

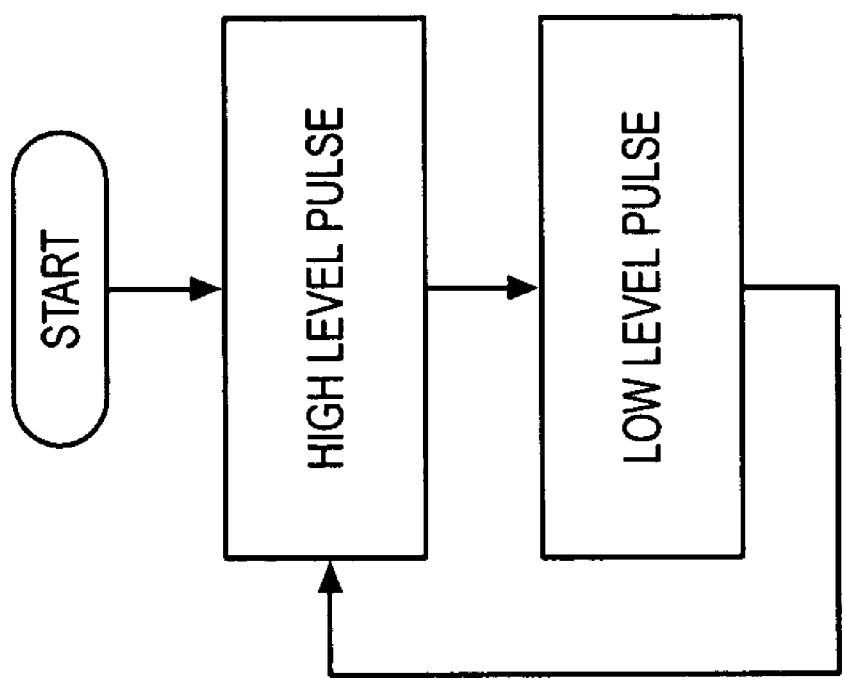

PULSED EXCITATION OF INDUCTIVELY COUPLED PLASMA SOURCES

BACKGROUND

1. Field

The present invention relates to the field of plasma sources for fabrication, pollution abatement, and cleaning processes. More specifically, the present invention relates to exciting the plasma of an inductively-coupled plasma source using pulsed power.

2. Description of the Related Art

Plasmas are typically generated in specially built chambers. Such plasma chambers can be used for gas dissociation in etching, implantation, deposition, or cleaning processes for semiconductor and micro-machining fabrication chambers. The plasma can also be used for materials processing, production of activated gases, pollutant abatement and other applications. In some applications, the plasma is generated from oxygen, argon and fluorinated gases by driving a continuous RF (Radio Frequency) current through the plasma. In such devices, the plasma is electromagnetically coupled to an excitation coil through either the air or a magnetic core. Since the excitation coil and the plasma can be modeled as the primary and secondary windings of a transformer, respectively, these inductively coupled plasma sources are sometimes also called transformer-coupled plasma sources. The plasma chamber may take different shapes, such as cylindrical, toroidal, and others. For semiconductor applications, the transformer's primary winding or coil is typically driven at RF frequencies in the range of 0.2–2 MHz, at power levels in the range of 2–10 KW.

A RF power generator is commonly used to drive the primary coil. The RF excitation for inductively coupled plasmas and other plasma sources is commonly applied in a continuous wave (CW) mode, i.e. the RF power is applied continuously to the plasma. Part of the CW mode delivered power is used to drive the reaction rate inside the plasma chamber, i.e. to dissociate and ionize the feeding gas. The reactions include dissociation, excitation and ionization. The rest of the CW mode power is dissipated from the plasma and deposited on the chamber walls in the form of heat. The dissipated power must constantly be removed to keep the walls of the chamber within the chamber's safe operational temperature range. For effective heat removal, the plasma chamber walls are typically made of thermally conductive metals, such as aluminum, and are cooled by water.

Manufacturing and industrial processes can be improved with yet higher gas flows, gas dissociation and pressures. Increasing the power supplied to the plasma increases the reaction rate within the plasma chamber, allowing the gas flow rate and pressure to be increased. However, higher power levels also increase the power dissipated to the chamber walls. As a result, in plasma sources operated in CW mode, the heat dissipation capability of the plasma chamber walls limits the amount of power that can be coupled to the plasma.

SUMMARY

The reaction rate of a feed gas flowed into a plasma chamber is controlled. In one embodiment a pulsed power supply repeatedly applies a high power pulse to the plasma chamber to increase the reaction rate of plasma within the chamber, and applies a low power pulse between applications of the high power pulses.

BRIEF DESCRIPTION OF THE DRAWINGS

The present invention is illustrated by way of example, and not by way of limitation, in the figures of the accompanying drawings in which like reference numerals refer to similar elements and in which:

FIG. 5 is a flow chart showing a method in accordance with one embodiment of the present invention.

DETAILED DESCRIPTION

Embodiments of the invention apply pulsed power to an inductively coupled plasma chamber. The excitation consists of high and low amplitude pulses, the duration of the low amplitude pulses being typically longer than that of the high amplitude pulses. Although the duration of the high amplitude pulses may be relatively short, the plasma reaction rates are greatly enhanced beyond their value in a CW discharge of the same average power due to their exponential dependence on electron temperature. At the same time, the longer, low-amplitude intervals between the high amplitude pulses reduce the total power that must be removed from the walls. Dissociation, excitation and ionization of the feeding gas are accordingly decoupled from power deposition on the plasma chamber walls. As a consequence, the gas is efficiently dissociated or ionized while the power dissipated in the form of heat is kept low as compared to a CW mode plasma chamber.

Overview

Figure 1:
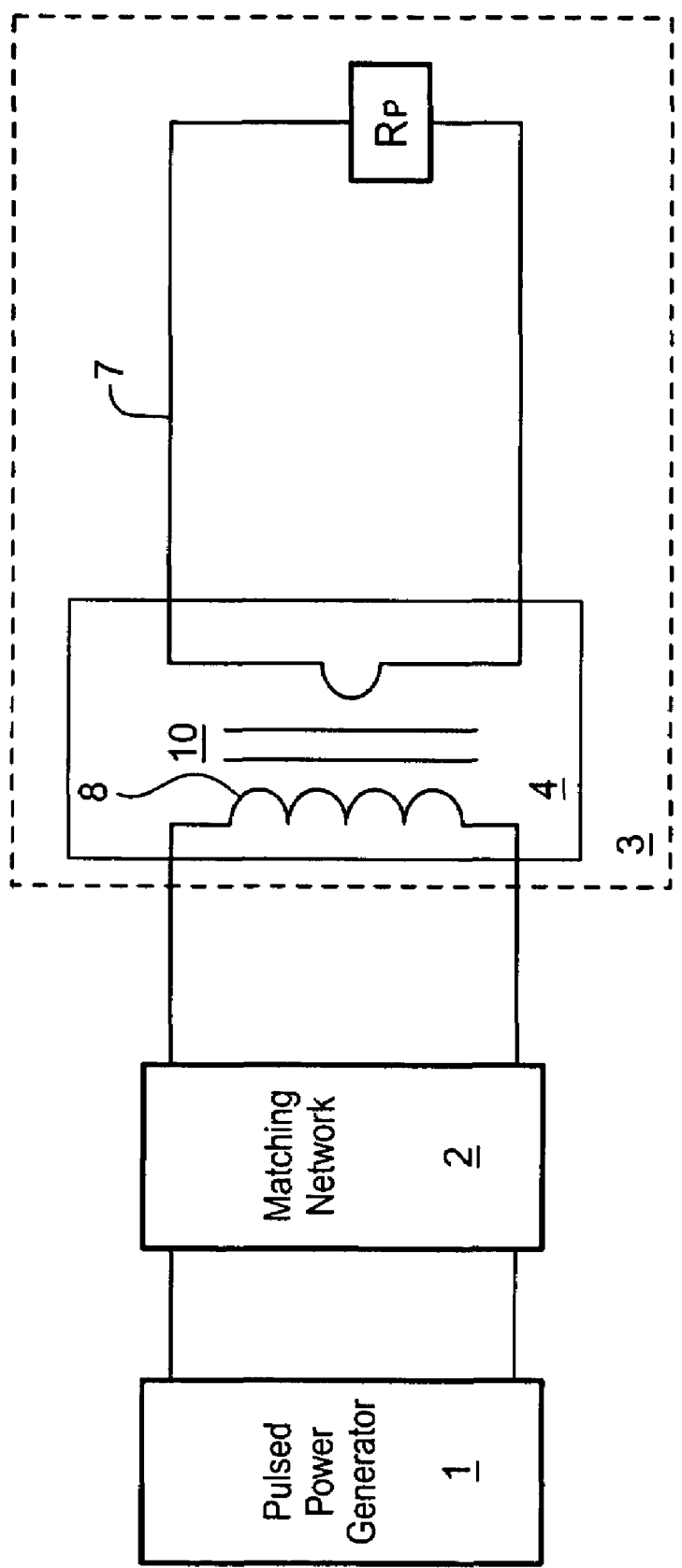
FIG. 1 shows a simplified circuit diagram of a power supply coupled to a load through an active matching network.

As shown in the example application of the simplified block diagram of FIG. 1, the plasma generator can use three primary subsystems, a pulsed power supply 1, an active matching network 2 and an inductively-coupled chamber 3. The matching network is optional.

The primary winding 8 of the transformer 4 is coupled to the active matching network 2. The power from the primary winding is coupled through a core 10, surrounding the plasma chamber, to the plasma 7, diagrammed in FIG. 1 as a secondary winding and a resistive load $R_p$. The core may be simply air, or made out of a magnetic material, as is usual in the case of toroidal, transformer-coupled discharges. The impedance matching network matches the impedance range of the pulsed power supply to the impedance of the plasma load. The diagram of FIG. 1 represents one type of plasma generation load. However, the present invention can be applied to a great variety of different plasma sources. In some applications, the power supply can be coupled directly to the plasma chamber without the matching network. In some applications, a different type of power source can be used.

The power coupled into the plasma via the transformer can be modulated over time. The amplitude, the frequency and the waveform can be varied based on the condition of the plasma and of the chamber. The waveform or amplitude over time can be changed in more complex ways to affect the power delivered to the plasma. By pulsing the applied power with appropriately short pulses spaced apart in time, plasma stability can be maintained while the average power is reduced. The pulse modulation can be a variation in voltage, current, frequency, peak power, or some other parameter.

Pulsed Waveforms

Figure 2A:
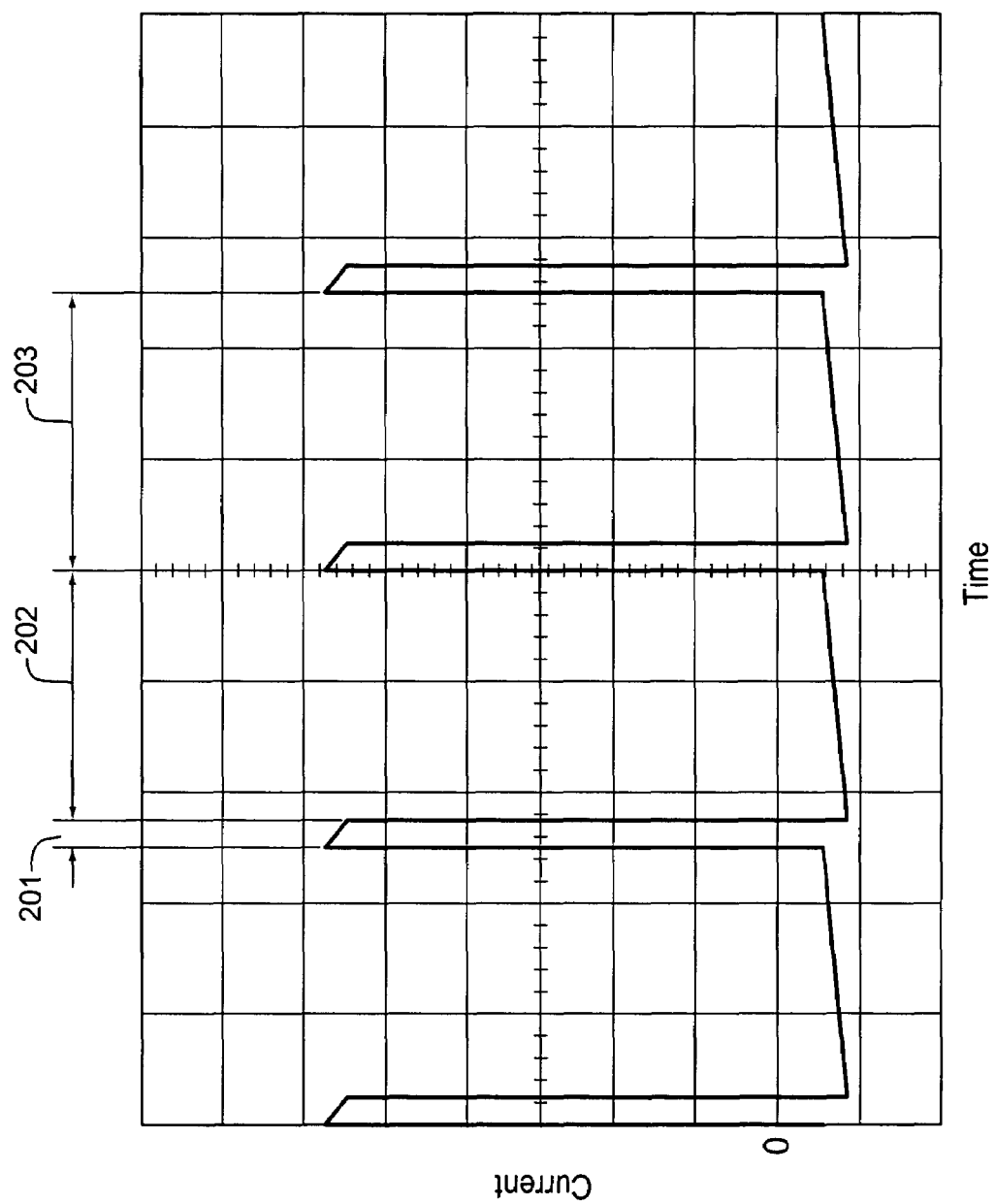
FIG. 2A is a graphical diagram of current pulses through a plasma in accordance with a first embodiment of the present invention, with current on the vertical axis and time on the horizontal axis.
Figure 2B:
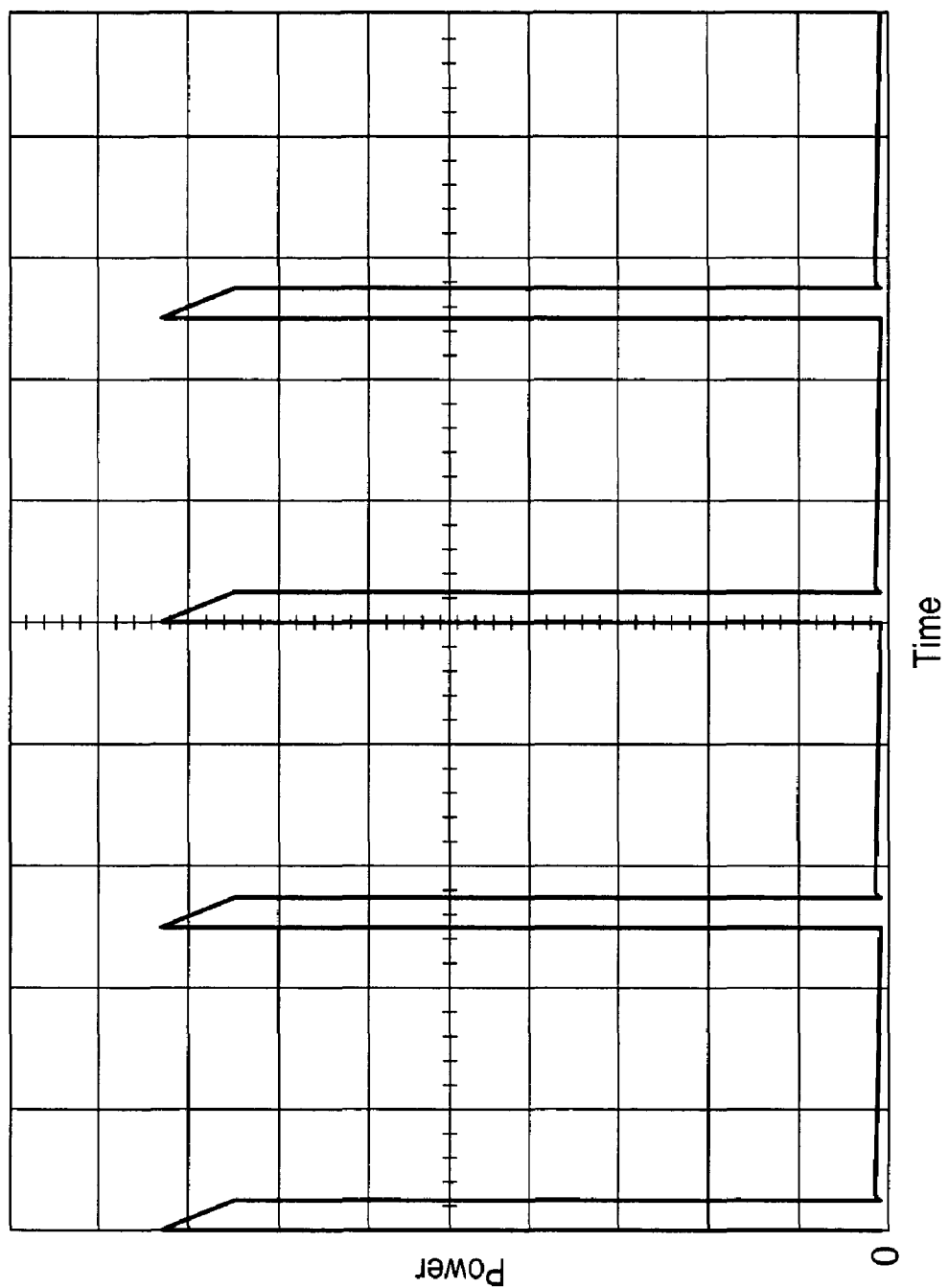
FIG. 2B is a graphical diagram of power pulses provided to a plasma in accordance with the first embodiment of the present invention, with power on the vertical axis and time on the horizontal axis.

FIGS. 2A and 2B show a simple example of a portion of a pulsed waveform that alternates between high and low amplitude stages. FIG. 2A represents the current through the plasma as a function of time, while FIG. 2B shows the power delivered to the plasma as a function of time. The current waveform has repeating high amplitude stages 201. During these stages, the power delivered to the plasma is significantly larger than that coupled to the plasma during the low amplitude stages 202. These stages together make up each period 203 of the waveform. The high amplitude stages are repeated regularly with the cycle of the period and are spaced apart in time. The low amplitude stages fall in between the high amplitude stages and, in the illustrated example, fill the entire interval between the high amplitude stages. However, there may be other features to the waveform within each or some of the periods.

The duration of the high amplitude stage 201 can be much shorter than that of the low amplitude stage 202, without destabilizing the plasma. This results in excitation waveforms with low duty cycles. The duty cycle of the excitation waveform can be considered as the duration of the high amplitude stage divided by the length of the period 203. When comparing a low duty cycle pulsed discharge with a CW discharge with the same average power, the power applied during the high amplitude stage of the pulsed discharge is much larger than the power applied to the plasma in the CW discharge. When the duration of the high amplitude stage is properly chosen, the electron temperature of the plasma rapidly increases many times above what the steady state value would be in a corresponding CW discharge with the same average power. Also during the high amplitude stage, the plasma density grows very rapidly. In other words, the amount of the feed gas that is ionized increases rapidly. The simultaneous increase of electron temperature and density leads to a sharp increase in the plasma reaction rates, well beyond the values obtained in a CW discharge with the same average power.

In the first portion of the low amplitude stage or afterglow step, the electron temperature within the plasma falls quickly, slowing the diffusion of particles to the walls. By reducing plasma losses to the walls, a pulsed mode excitation can provide higher average plasma densities than those achieved with a CW mode plasma source driven at the same average power. If the duration of the low amplitude stage is longer than that of the high amplitude stage, the plasma can exist primarily in a so-called "after glow" state. This state is much cooler than a constant energy state, significantly reducing the interior temperature of the plasma chamber for the same plasma energy density.

While the high and low amplitude stages of the curve in FIG. 2A are shown as linear ramps, the general shape will depend upon how the constructive details of the plasma chamber as well as where the current, voltage or power is being measured. For some applications, it may be preferred to make the waveform of FIG. 2A smoother. The specific shape of the curves in the two stages can be adapted to match the desired excitation characteristics of the plasma and plasma chamber.

The specific parameters of the FIGS. 2A and 2B waveform depend on the particular application. This can include the design of the plasma chamber, the operating pressures and temperatures, the input flow rate, the amplitude of the power pulses, and the particular gases involved, among other things. In a plasma systems for cleaning semiconductor processing chambers, the high amplitude stage may last anywhere from 10 to 200 microseconds. The duration of the high amplitude stage can be selected based on a particular application and will depend, at least in part, on some of the factors mentioned above. The duration of the high amplitude stage should be selected as greater than the electron energy relaxation time and shorter than the electron density relaxation time. This allows for efficient electron heating without significant losses.

The low amplitude stage may last, in the cleaning chamber example, anywhere from 100 to 2000 microseconds. The selected duration depends on plasma and excitation conditions. Based on this example, the duty cycle of the modulated excitation waveform is about 10 percent. The duty cycle for any particular application will depend on excitation and plasma conditions. These can include chamber pressure, amplitude of the pulses, and frequency of the supplied power.

The low amplitude stage should be designed to deliver a relatively low amount of power to the plasma; for example, the power deposited can be one or two orders of magnitude less than that deposited during the high amplitude stage. The amplitude difference between high and low amplitude stages can affect the relative durations of the respective stages. The maximum low amplitude duration can be reduced by the amount of power deposited during the low amplitude stage. In addition, if the maximum plasma density is increased through an increase in power deposited during the high amplitude stage, the duration of the low amplitude stage can be increased accordingly. In one embodiment, the duration of the low amplitude cycle is limited so that electrons and ions do not recombine or fall to the walls in such large numbers that the plasma becomes hard to reignite.

Figure 3A:
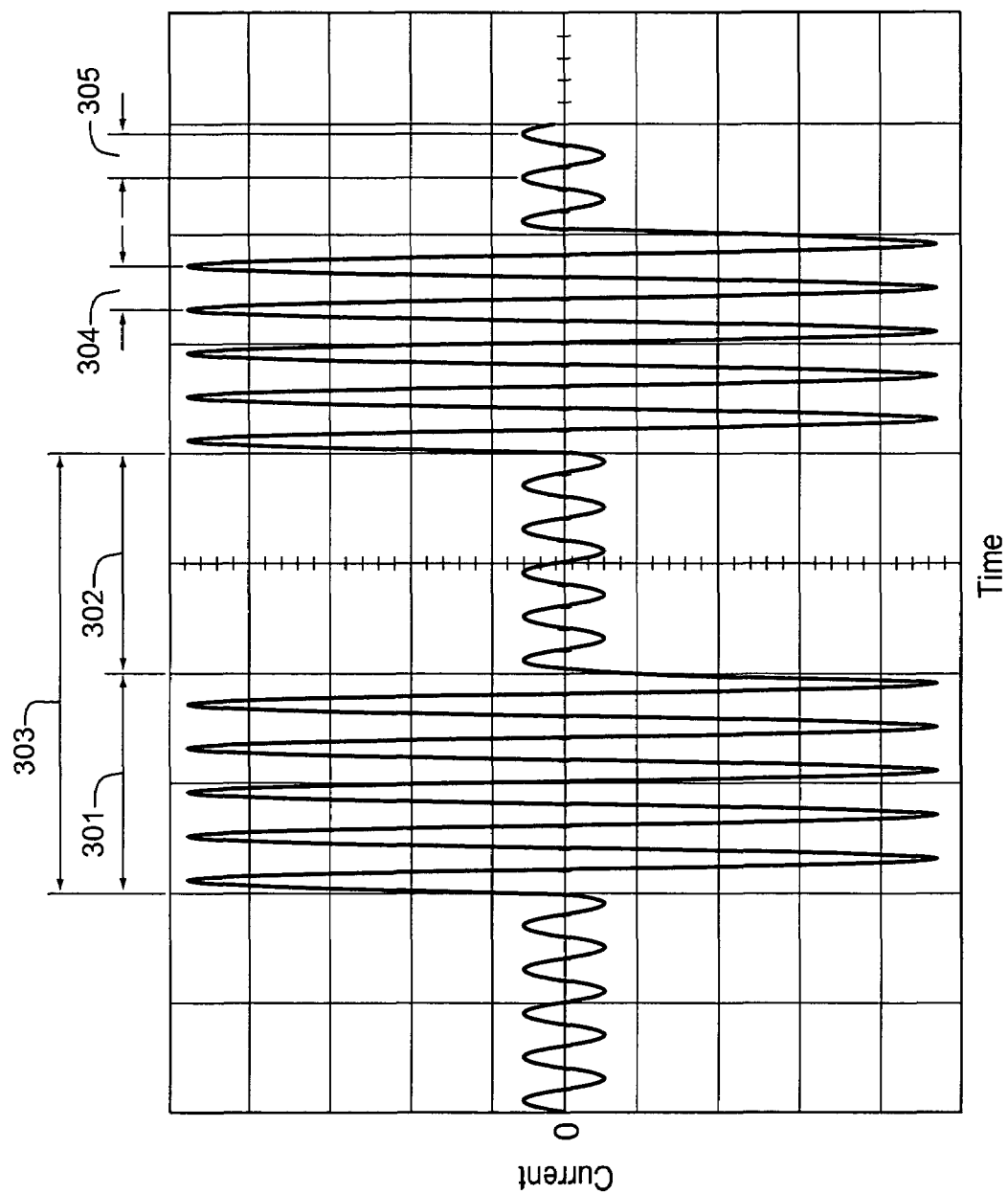
FIG. 3A is a graphical diagram of current pulses through a plasma in accordance with a second embodiment of the present invention, with current on the vertical axis and time on the horizontal axis.
Figure 3B:
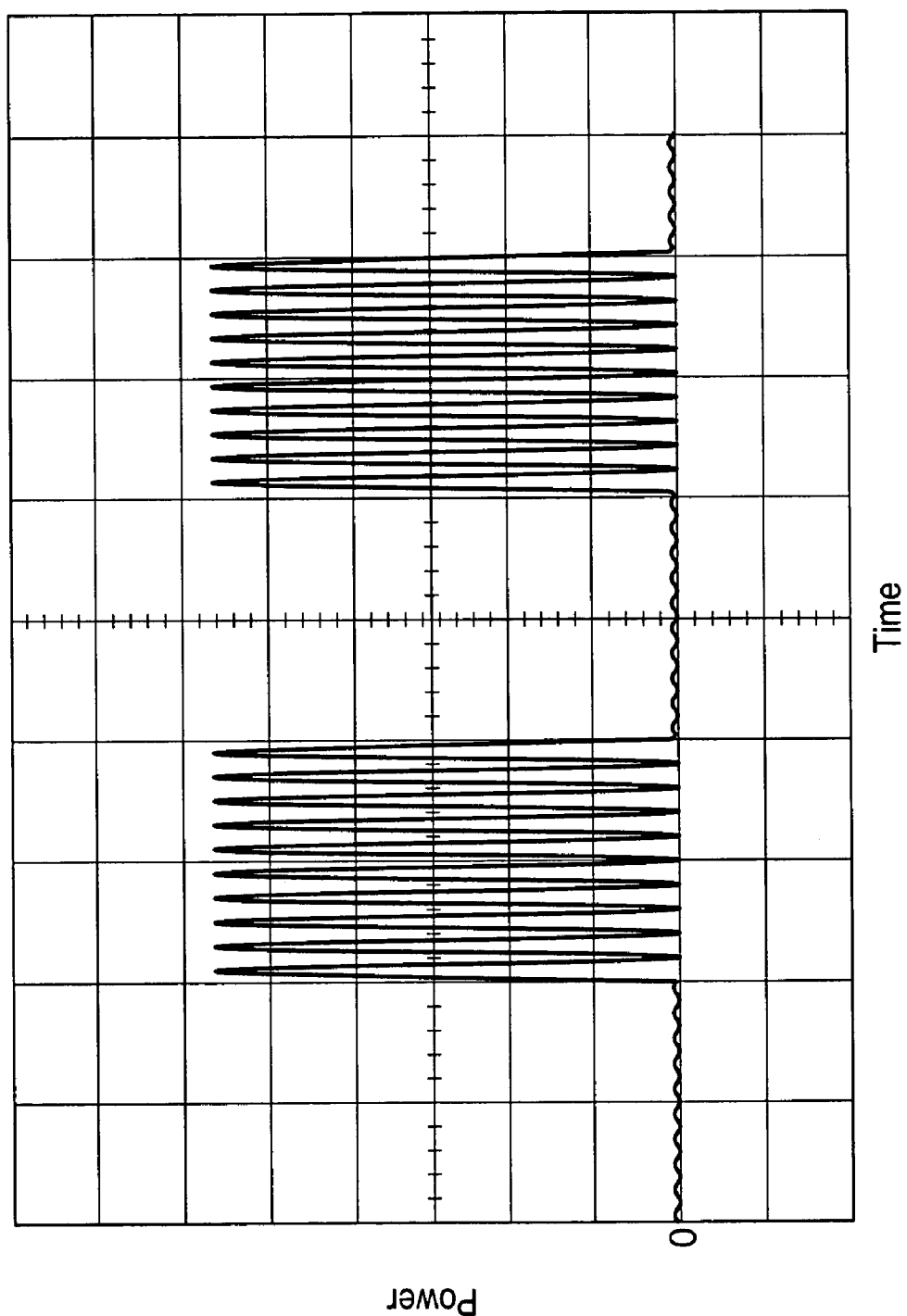
FIG. 3B is a graphical diagram of power pulses provided to a plasma in accordance with the second embodiment of the present invention, with power on the vertical axis and time on the horizontal axis.

FIGS. 3A and 3B show another example of a portion of a pulsed waveform. FIG. 3A represents the current through the plasma as a function of time, while FIG. 3B shows the power delivered to the plasma as a function of time. The waveform of FIGS. 3A and 3B is a pulsed RF (radio frequency) waveform that alternates between high and low amplitude stages 301, 302. Each stage is composed of a train of AC (alternating current), RF cycles 305, 304. The frequency of the cycles at each stage is relatively constant or is controlled independently of the pulsed power delivery. The frequency, for example, could be determined by a separate power control loop. The waveform has repeating high amplitude stages 301. As with the example of FIGS. 2A and 2B, the high and low amplitude stages alternate and are repeated each period 303.

As with the example of FIGS. 2A and 2B, the high amplitude stage is used to excite the plasma and the low amplitude stage allows heat to dissipate without complete relaxation of the plasma. The specific parameters of the FIGS. 3A and 3B waveform also depend on the particular application, including the intended frequency of the RF power. In plasma systems for cleaning semiconductor-processing chambers, the waveform may have a frequency of the order of 0.5–2 MHz.

While the high and low amplitude stages of the curve in FIGS. 3A and 3B are shown as having a constant amplitude and frequency, the general shape will depend upon the constructive details of the chamber as well as where the current, voltage or power is being measured. While it is possible, using a switched AC power supply, to provide maximum peak power in one cycle, the system, including the plasma may not be able to absorb this power because of various impedances. Accordingly, the power at the primary coil may take a few cycles to ramp up from the low amplitude stage to the high amplitude stage. For some applications, it may be preferred to ramp the power supply output power up smoothly over a few cycles. In addition to ramping up the amplitude, the frequency can also be increased. Similarly for some applications, it may be preferred to ramp the power supply output power down more smoothly than is shown in FIGS. 3A and 3B.

The low amplitude stage should be designed to couple a relatively low amount of power to the plasma, for example, the power deposited can be one or two orders of magnitude less than that of the high amplitude stage. Alternatively, the applied power during this stage can be zero, i.e., the power supply or its output can be turned off during this stage. The amplitude difference between high and low amplitude stages can affect the relative durations of the respective stages.

Figure 4A:
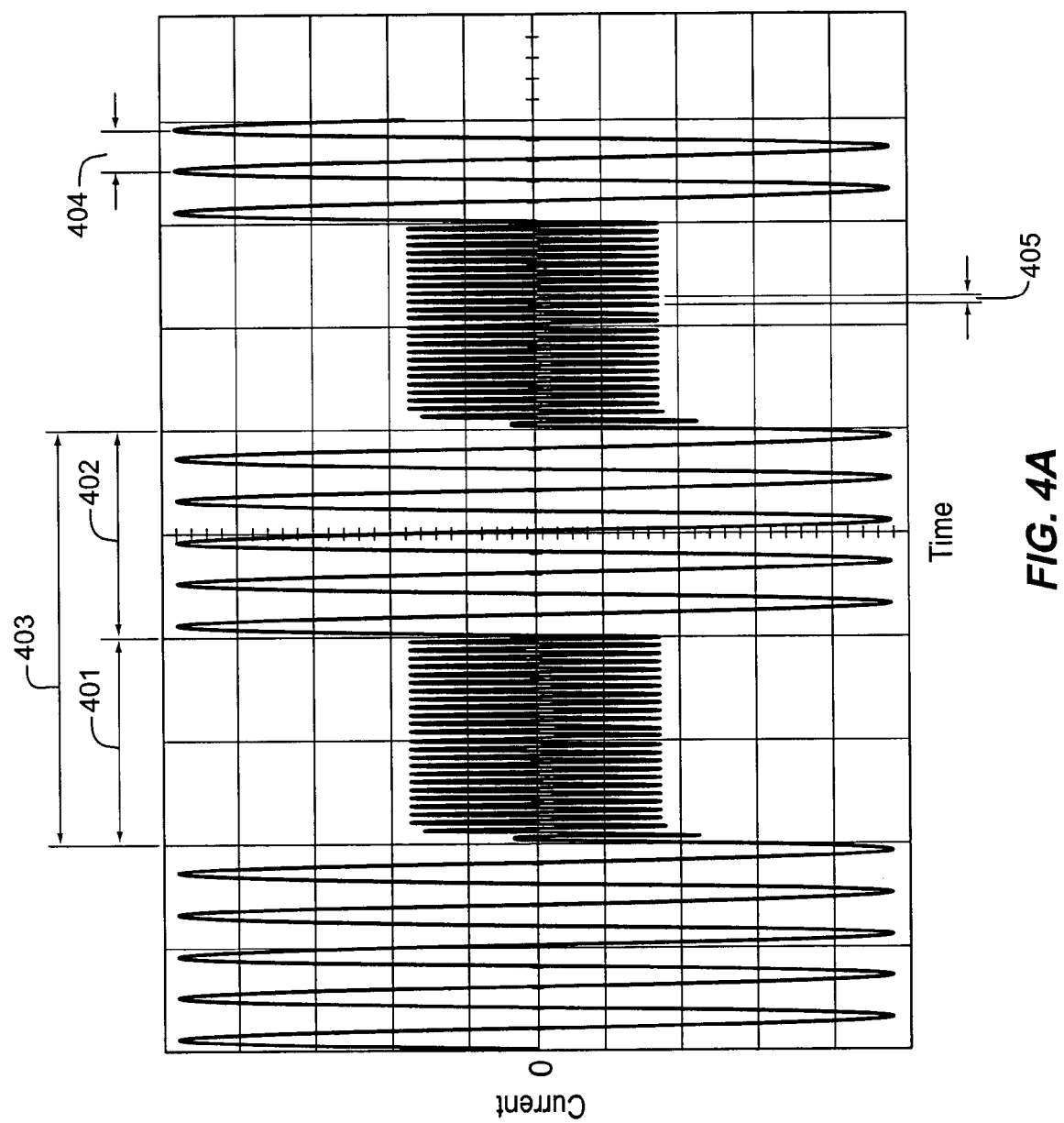
FIG. 4A is a graphical diagram of current pulses through a plasma in accordance with a third embodiment of the present invention, with current on the vertical axis and time on the horizontal axis.
Figure 4B:
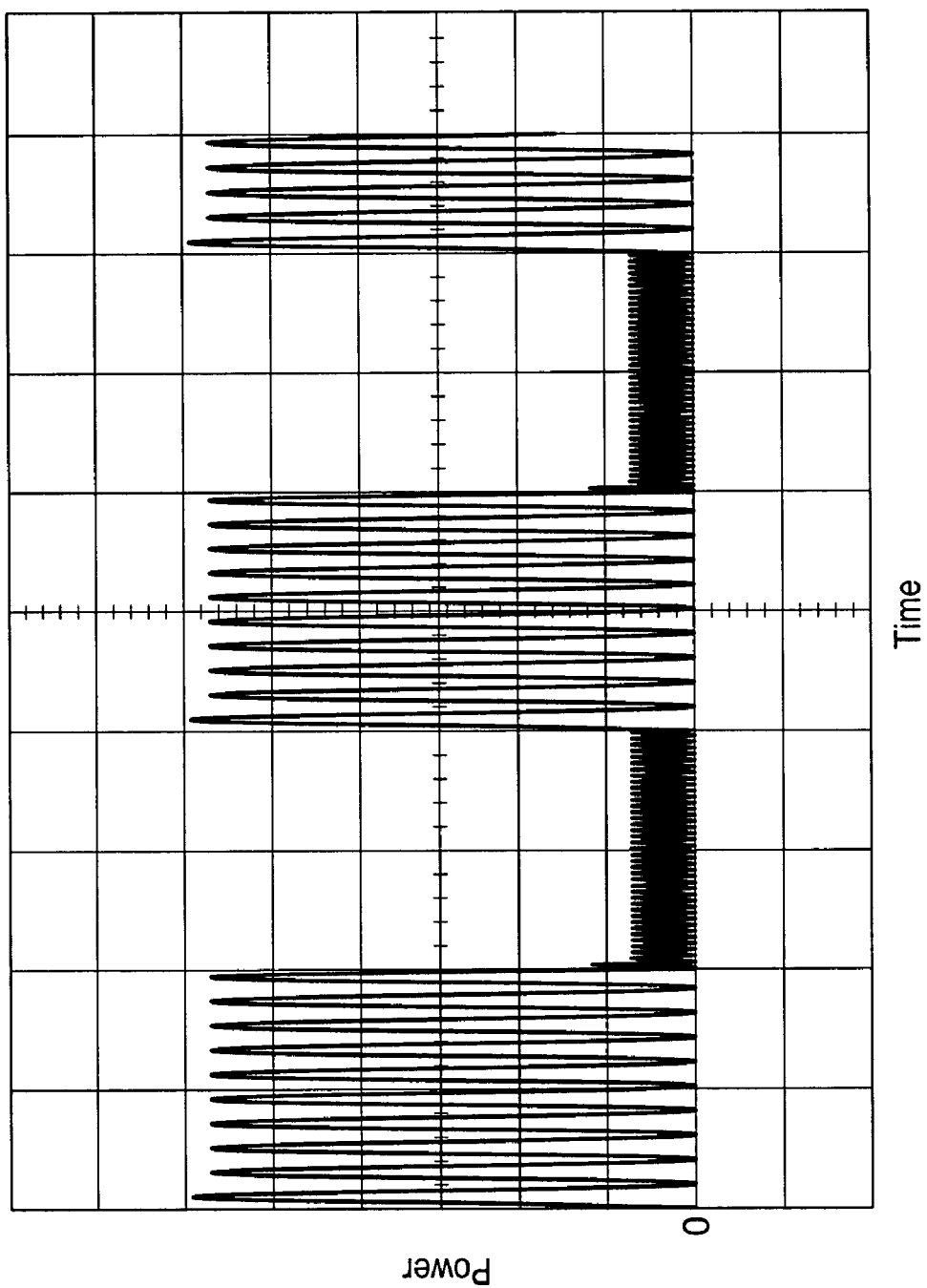
FIG. 4B is a graphical diagram of power pulses provided to a plasma in accordance with the third embodiment of the present invention, with power on the vertical axis and time on the horizontal axis.

FIGS. 4A and 4B show a third example of a waveform resulting from pulsed excitation of an inductively coupled plasma. Current and power are again plotted against time. The waveform of FIG. 4A is also a pulsed RF (radio frequency) waveform that alternates between high and low amplitude stages 401, 402. Each stage is composed of a train of AC (alternating current), RF cycles 405, 404.

In the example of FIGS. 4A and 4B, however, the high and low amplitude trains of AC cycles differ in frequency. This difference is designed to exploit the properties of an attached active matching network 2. During the high amplitude stage 401, the frequency of the power generator is adjusted so it falls within the range in which the matching network is able to match the impedance of the plasma to the output impedance of the power generator. This results in a high level of power being delivered to the plasma. For the low amplitude step 402, the operating frequency is chosen to be beyond the range of the active matching network. As a result, the load, as seen by the generator, is not matched to the generator's impedance, resulting in a significant drop in the power delivered to the plasma.

As an alternative, during the low amplitude stage, the impedance matching network can be detuned and set not to actively adjust. In this case, for the low amplitude stage, the frequency of the supplied power need not be adjusted beyond the range of the matching network. It can be adjusted only enough to sufficiently reduce the power as compared to the high amplitude stage. As a further alternative, the impedance match can be changed instead of the power supply frequency. The resulting power output would look similar to that of FIGS. 3A and 3B. However, at the power supply, the forward power would be at constant frequency and amplitude. For the high amplitude stage, the impedance matching network is set to provide a close match for optimal power delivery to the plasma. For the low amplitude stage the impedance matching network is set to provide a poor match in order to reduce power delivery. The difference between the high level and the low level can be chosen in the same way as with FIGS. 2A and 3A.

Control and Design

As mentioned above, the characteristics of the pulsed power waveform can be defined in a variety of different ways and the optimal waveform will depend upon the particular application, including the plasma, its parameters, its uses and the equipment being used. One approach to determining an optimal waveform is to first determine the parameters, e.g. frequency, voltage, current, impedance etc. of a conventional CW waveform. Although these values may provide a suitable starting point towards a satisfactory pulsed waveform, it is not necessary that each or any of them be satisfied. They are provided only as working examples. For example, as shown in FIG. 2A, the frequency of the high amplitude stage can be very different from that of a CW waveform. As another example, using a pulsed waveform, the average power can often be increased in the same plasma chamber over what is possible using a CW waveform. In addition, the parameters of the plasma vary over time. Just as CW waveforms may vary over time in response to the plasma, the waveforms shown in the figures can be varied over time in response to changing conditions or in order to change the conditions.

The low amplitude stage should be long enough to allow the plasma to cool but not long enough to require reignition. One useful measure is the electron density relaxation time. The low amplitude stage can be set to last for a few relaxation times without negatively affecting the stability of the plasma. The particular amplitude and frequency of the low amplitude stage is not critical as long as it couples some sustaining level of power into the plasma. It is possible for the low amplitude stage to be very close to or very far from the power levels of the high amplitude stage.

A process for maintaining a plasma is shown in summary in FIG. 5. This process flow represents one of the many variations described above and many variations to the illustrated control process can be made. In one embodiment, the power supply generates 31 a high amplitude pulse and it is transmitted to the primary coil. It then generates 32 a low amplitude pulse that is transmitted to the primary coil. This process is repeated as long as the feed gas is to be processed. The parameters of the pulses and the spacing, if any between high and low amplitude stages, will depend on the particular application. The process can begin with either the high amplitude or the low amplitude stage, and other steps can be added to the process.

The pulsed waveform of FIGS. 2A through 4B can be achieved through changes in frequency using a frequency control loop. The waveforms can also be achieved by changing the output voltage or current of the power supply using similar control processes. As an alternative, a separate power control loop can be added to the system that adjusts the input power between the mains or the rectifier and the switching network. By reducing the power into the AC switching system, the output power can be reduced without affecting the frequency or other control parameters of the power supply switches. The control loops can be changed to avoid any compensation for the intentional input power fluctuations.

General Matters

In the description above, for purposes of explanation, numerous specific details are set forth in order to provide a thorough understanding of the present invention. It will be apparent, however, to one skilled in the art that the present invention may be practiced without some of these specific details. In other instances, well-known circuits, structures, devices, and techniques have been shown in block diagram form or without detail in order not to obscure the understanding of this description.

The present invention includes various steps, but steps can be added to or deleted from any of the methods without departing from the basic scope of the present invention. It will be apparent to those skilled in the art that many further modifications and adaptations can be made. The particular embodiments are not provided to limit the invention but to illustrate it. The scope of the present invention is not to be determined by the specific examples provided above but only by the claims below.

The steps of the present invention may be performed by hardware components, or may be embodied in machine-executable instructions, which may be used to cause a general-purpose or special-purpose processor or logic circuits programmed with the instructions to perform the steps. Alternatively, the steps may be performed by a combination of hardware and software. The steps have been described as being performed by certain modules or systems and by either the impedance matching network or the power supply. However, many of the steps described as being performed by one component may be performed by another component and vice versa.

Furthermore, while the invention has been illustrated in the context of a plasma generator and a switched RF power supply, the invention is not so limited. It can be applied to a great variety of different loads, power supplies and chamber topologies. There are also a wide variety of different frequencies to which the present invention can be applied.

It should also be appreciated that reference throughout this specification to "one embodiment" or "an embodiment" means that a particular feature may be included in the practice of the invention. Similarly, it should be appreciated that in the foregoing description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the Detailed Description are hereby expressly incorporated into this Detailed Description, with each claim standing on its own as a separate embodiment of this invention.

What is claimed is:

1. A method comprising:
    applying repeatedly a high power pulse to a plasma chamber to increase the reaction rate of plasma within the chamber; and
    applying, between applications of the high power pulses, a low power pulse wherein applying the low power pulse comprises actively detuning a pulsed power generator with respect to the plasma by changing the operating frequency of the power generator beyond the range of an active matching network between the power generator and the plasma.

2. The method of claim 1, wherein the low power pulses are applied to allow the temperature of the plasma within the plasma chamber to diminish.

3. The method of claim 1, wherein the high power and low power pulses alternate in spaced time intervals.

4. The method of claim 1, wherein applying a high power pulse comprises applying the power at evenly spaced intervals with a constant spacing of time between the intervals.

5. The method of claim 1, wherein applying the high power pulse comprises pulsing the coil at a selected alternating current frequency.

6. The method of claim 5, wherein the selected frequency is selected based on the conditions of the plasma.

7. The method of claim 1, where applying the high and low power pulses comprise applying the high and low power pulses through an air-coupled coil.

8. The method of claim 1, wherein the high and low power pulses are applied to the plasma through a coil magnetically coupled to the plasma through a magnetic core.

9. The method of claim 1, wherein applying a high power pulse comprises modulating the amplitude of a pulsed power generator.

10. The method of claim 1, further comprising modulating the amplitude of the high power pulse based on the conditions of the plasma.

11. An apparatus comprising:
    a coil to couple power to a plasma in a plasma chamber; and
    a pulsed power generator coupled to the coil to apply power to the coil
    to repeatedly apply a high power pulse to the coil to increase the reaction rate of the plasma within the chamber, and to apply a low power pulse to the coil between applications of the high power pulses; and
    an active matching network between the pulsed power generator and the coil and wherein the pulsed power generator applies the low power pulse by changing the operating frequency of the power generator beyond the range of the active matching network.

12. The apparatus of claim 11, wherein the low power pulses allow the temperature of the plasma within the plasma chamber to diminish.

13. The apparatus of claim 11, wherein the high power and low power pulses alternate in spaced time intervals.

14. The apparatus of claim 11, wherein the pulsed power generator applies the high power pulse by pulsing the coil at a selected alternating current frequency.

15. The apparatus of claim 11, wherein the pulsed power generator applies the low power pulse by actively detuning with respect to the plasma.

16. The apparatus of claim 11, wherein the coil comprises an air-coupled coil.

17. The apparatus of claim 11, wherein the coil comprises a magnetic core.

18. The apparatus of claim 11, wherein the pulsed power generator modulates the amplitude of the high power pulse based on the conditions of the plasma.

19. A machine-readable medium having stored thereon data representing instructions which, when executed by a machine, cause the machine to perform operations comprising:
    applying repeatedly a high power pulse to a plasma chamber to increase the reaction rate of plasma within the chamber;
    applying, between applications of the high power pulses, a low power pulse; and changing the operating frequency of a power generator beyond the range of an active matching network that is connected between the power generator and the plasma.

20. The medium of claim 19, wherein the instructions for applying a high power pulse comprise instructions which, when executed by the machine, cause the machine to perform further operations comprising applying the power at evenly spaced intervals with a constant spacing of time between the intervals.

21. The medium of claim 19 wherein the instructions for applying a high power pulse comprise instructions which, when executed by the machine, cause the machine to perform further operations comprising modulating the amplitude of a pulsed power generator.

22. The medium of claim 19, further comprising instructions which, when executed by the machine, cause the machine to perform further operations comprising modulating the amplitude of the high power pulse based on the conditions of the plasma.

23. A method comprising:
   applying repeatedly a high power pulse to a plasma chamber to increase the reaction rate of plasma within the chamber; and
   applying, between applications of the high power pulses, a low power pulse wherein applying the low power pulse comprises actively detuning a pulsed power generator with respect to the plasma by changing the settings of an active matching network that is coupled between the power generator and the plasma.

24. The method of claim 23, further comprising modulating the amplitude of the high power pulse based on the conditions of the plasma.

25. The method of claim 23, wherein applying the high power pulse comprises pulsing the coil at a selected alternating current frequency based on the conditions of the plasma.

26. An apparatus comprising:
   a coil to couple power to a plasma in a plasma chamber;
   a pulsed power generator coupled to the coil to repeatedly apply a high power pulse to the coil to increase the reaction rate of the plasma within the chamber and to apply a low power pulse to the coil between applications of the high power pulses: and
   an active matching network between the pulsed power generator and the coil and wherein the pulsed power generator applies the low power pulse by changing the settings of the active matching network.

27. The apparatus of claim 26, wherein the coil comprises an air-coupled coil.

28. The apparatus of claim 26, further comprising the coil is magnetically coupled to the plasma through a magnetic core and wherein the high and low power pulses are applied to the plasma through the magnetic core.

* * * * *